(12) United States Patent
Beasley et al.

(10) Patent No.: US 8,088,991 B2
(45) Date of Patent: Jan. 3, 2012

(54) THREE-TERMINAL TWO-JUNCTION PHOTOVOLTAIC CELLS AND METHOD OF USE

(75) Inventors: Matthew Beasley, Dallas, OR (US); Conor D. Kelly, Albany, OR (US); Wiatt E. Kettle, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 750 days.

(21) Appl. No.: 12/251,162

(22) Filed: Oct. 14, 2008

(65) Prior Publication Data

US 2010/0089442 A1    Apr. 15, 2010

Related U.S. Application Data

(60) Provisional application No. 61/083,564, filed on Jul. 25, 2008.

(51) Int. Cl.
*H01L 31/00* (2006.01)
(52) U.S. Cl. ........................................................ 136/255
(58) Field of Classification Search .................. 136/255
See application file for complete search history.

(56) References Cited

U.S. PATENT DOCUMENTS

| | | | |
|---|---|---|---|
| 5,677,833 | A | 10/1997 | Bingley |
| 5,684,385 | A | 11/1997 | Guyonneau et al. |
| 6,104,624 | A | 8/2000 | Iwamoto et al. |
| 6,433,522 | B1 | 8/2002 | Siri |
| 7,019,987 | B2 | 3/2006 | Onoe |
| 7,030,597 | B2 | 4/2006 | Bruno et al. |
| 7,072,194 | B2 | 7/2006 | Nayar et al. |
| 2005/0063115 | A1 | 3/2005 | Nayar et al. |

*Primary Examiner* — Basia Ridley
*Assistant Examiner* — Tamir Ayad (57) ABSTRACT

A method of operating a multi-junction photovoltaic cell with junctions connected in series includes operating each junction at a different, respective maximum power point. A photovoltaic circuit includes: at least one multi-junction photovoltaic cell, comprising at least first, second, and third terminals; a first junction of the photovoltaic cell positioned intermediate the first and second terminals; a second junction of the photovoltaic cell positioned intermediate the second and third terminals; and a device for independently setting current flow through the first junction and the second junction to allow for maximum power point operation of each junction, the device for setting current flow being connected to the second terminal.

19 Claims, 7 Drawing Sheets

Fig. 8

THREE-TERMINAL TWO-JUNCTION PHOTOVOLTAIC CELLS AND METHOD OF USE

CROSS REFERENCE TO RELATED APPLICATIONS

This Application claims the benefit of U.S. Provisional. Application Ser. No. 61/083,564, filed Jul. 25, 2008, titled "Three-terminal Two-junction Photovoltaic Cells And Method Of Use" which is hereby incorporated by reference herein as if reproduced in full below.

STATEMENT OF GOVERNMENT INTEREST

The invention that is the subject of this patent application was made with U.S. Government support under Subcontract No. CW135971, under Prime Contract No. HR0011-07-9-0005, through the Defense Advanced Research Projects Agency (DARPA). The U.S. Government has certain rights in this invention.

BACKGROUND

Multi-junction photovoltaic cells provide a method for increasing the efficiency of solar cells and panels and other devices that produce or use electrical energy from light. In multi-junction photovoltaic cells, each junction has a band gap attuned to capture a specific range of photon energies in the visible spectrum. Generally, each junction in a cell has a different band gap in order to broaden the range of photon energies which a cell is able to capture. This helps to increase the overall efficiency of the cell.

Photovoltaic cells produce peak power at only one current and voltage operating point. This one operating point is known as the maximum power point (MPP). Operation at any other point reduces the output power and hence cell efficiency. However, in a multiple junction series connected cell, operating every junction at its respective peak power point is difficult because each junction will have a different MPP due to the differing band gaps of the junctions.

Placing the junctions in series dictates that the same current flow through successive junctions. Consequently, where this current does not match the MPP of a junction through which it is flowing, the efficiency of that junction will be compromised. By preventing one or more of the junctions from operating at its MPP, the overall power output and efficiency of the cell is lower than if all the junctions were operated at their MPPs.

The junctions could be connected in parallel in an attempt to operate more of the junctions at their respective MPPs. However, parallel connections result in a lower efficient for downstream power converters that aggregate and condition the electrical output of the cell. Consequently, multi-junction photovoltaic cells have not been successfully commercialized.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

The present specification describes a method of interconnecting multiple junction photovoltaic cells in series while still providing for all junctions to be operated at their respective maximum power points (MPPs). The present specification also describes multiple junction photovoltaic cells that include junctions connected in series while still providing for all junctions to be operated at their respective maximum power points (MPPs).

As used in the present specification and in the appended claims, the term "maximum power point" (MPP) refers to a point on the current-voltage curve of a photovoltaic junction (representing the current and voltage at which the junction operates) where maximum power output may be obtained. MPP is affected by several factors, some examples of which are discussed in the present specification.

Multi-junction photovoltaic cells (having at least two or more junctions) may be internally wired on an electronic chip for series connection or parallel connection. As noted above, series connection provides for simpler and more efficient electrical conversion, but generally suffers from lower quantum efficiency due to mismatches between the current of each junction. Parallel connection requires three terminals and suffers from the inability to easily series connect cells for higher output voltage.

In attempts to solve the problem of current mismatch and to reduce the losses resulting from such, some cell designers try to make the MPP current of each junction the same by tailoring one or both of the band gap energies of the junctions. Additionally, it is possible to intentionally thin the upper junction of the cell so that some of the higher energy light can penetrate to the lower junction and be collected there. However, thinning the upper junction to allow higher energy light to penetrate to the lower junction comes at the penalty of lower collection efficiency due to the lower operating voltage of the lower band gap junction. Even when balanced, additional loss can occur if the spectrum of the incoming light shifts.

A method allowing each junction to operate at its respective MPP current without using the aforementioned configurations would eliminate the losses from current mismatch while still allowing the cell to retain higher photon collection efficiency.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Figure 1:
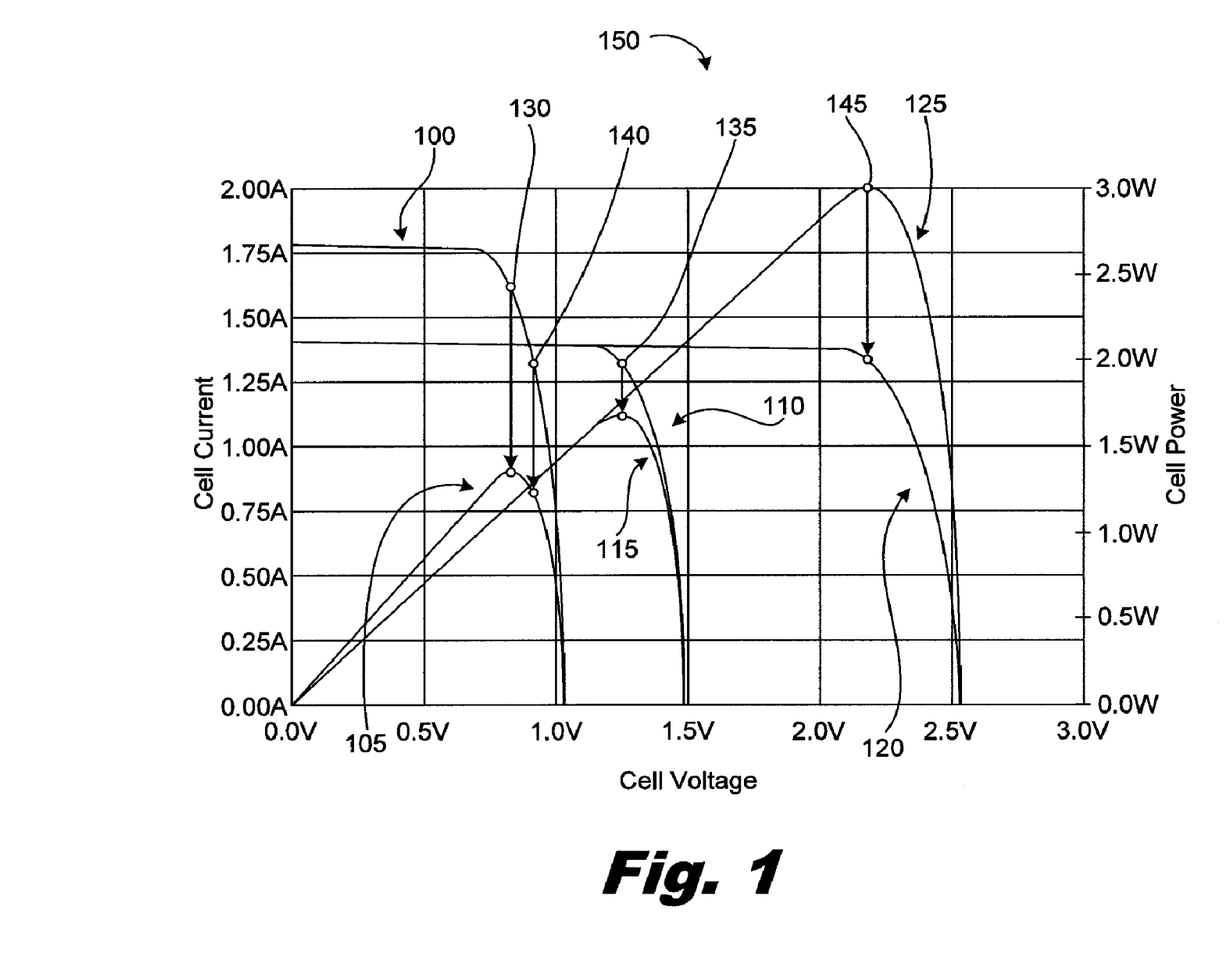
FIG. 1 is a graph showing one illustrative embodiment of current and power curves for a series two-junction, two-terminal photovoltaic cell.

In the illustrative graph (150) of FIG. 1, a plurality of curves are shown representing current, voltage, and power relationships through a two-junction, two-terminal photovoltaic cell. A first current-voltage (I-V) curve (100) represents possible current and voltage values through a first junction. A corresponding first power curve (105) represents the power produced by the first junction at each current value in the first I-V curve (100).

A second I-V curve (110) represents possible current and voltage values through a second junction with a higher band gap than the first junction. A corresponding second power curve (115) represents the power produced by the second junction at each current and voltage value in the second I-V curve (110).

A third I-V curve (120) represents possible current and voltage values through both the first and second junctions placed in series. A corresponding third power curve (125) represents the power produced by the first and second junctions at each current and voltage value in the third I-V curve (120).

A first set of points (130), on the first I-V curve (100) and first power curve (105), illustrates the maximum power point (MPP) of the first junction. A second set of points (135), on the second I-V curve (110) and second power curve (115), illustrates the MPP of the second junction. As can be seen in FIG. 1, the current and voltage at which the first junction operates at MPP are different than the current and voltage at which the second junction operates at MPP. Because the junctions are placed in series and the cell has only two terminals, the junctions must operate at the same current, preferably at the current which would allow the second junction to operate at its MPP because of its lower operating current.

A third set of points (140), on the first I-V curve (100) and first power curve (105), illustrates the power produced by the first junction when operated at the MPP current of the second junction. The MPP current and power for the series-combined junctions are illustrated by a fourth set (145) of points placed on the third I-V curve (120) and third power curve (125). When the two junctions are placed in series, the first junction does not produce its maximum power when operating at the MPP current of the second junction. This, results in a lower overall output for the series-combined junctions than if each of the junctions were operated at its respective MPP.

Depending on the incoming spectrum and the band gaps of the two junctions, either junction may have a higher operating current. The band gap of each junction is determined by the semiconductor material used to make that junction. If the photovoltaic cell has more than two junctions in series, each junction may have a different operating current, which may result in larger deviations from the MPP of each junction and larger losses.

Figure 2:
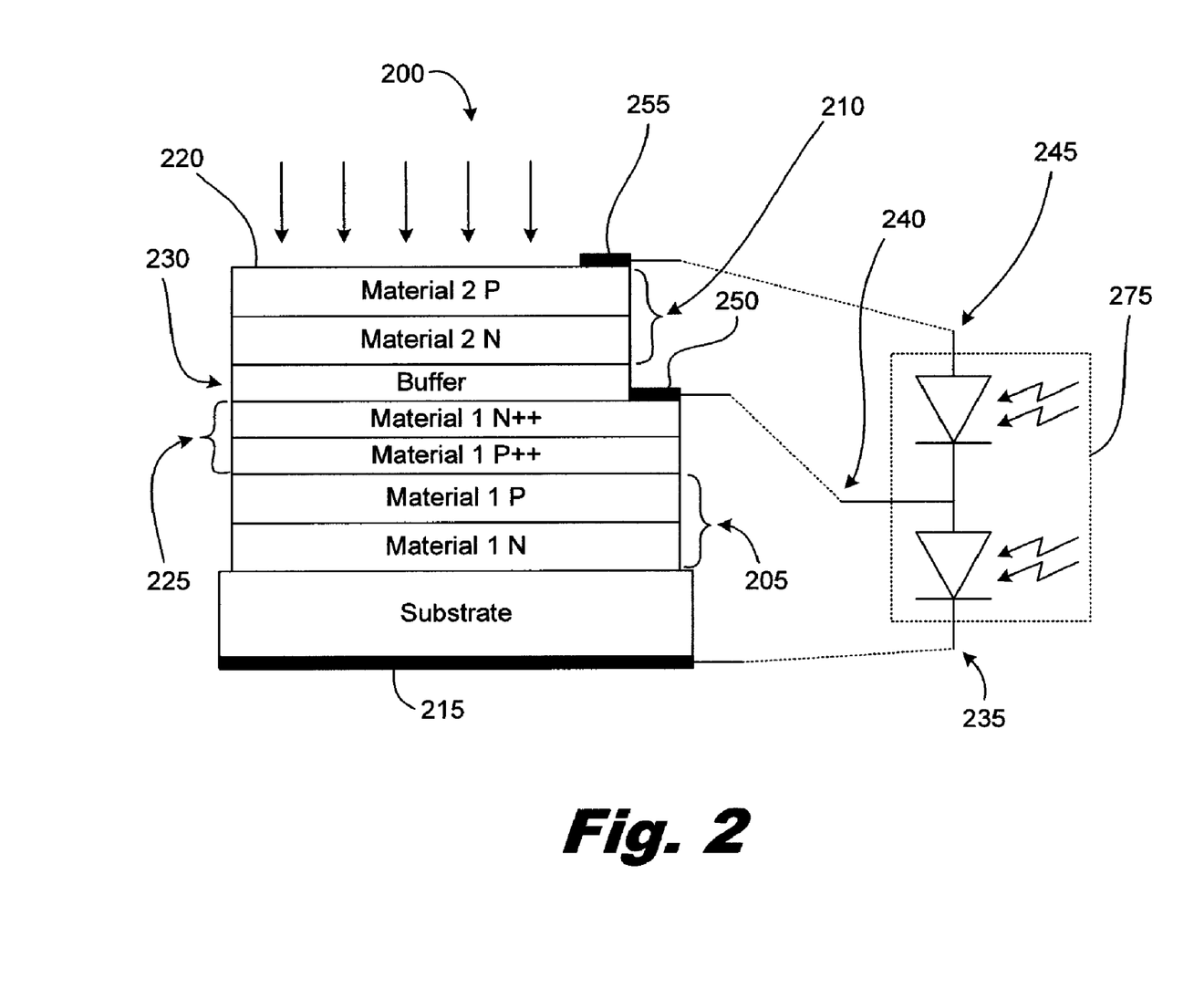
FIG. 2 is a diagram showing one illustrative embodiment of a series multi-junction photovoltaic cell according to principles described herein.

FIG. 2 illustrates a possible embodiment of a series, two-junction photovoltaic cell (200). FIG. 2 also includes a circuit depiction (275) of the photovoltaic cell (200). The junctions in the cell (200) may be p-n junctions. The p-n junctions may be constructed by doping each side of a light-absorbing material with different concentrations of holes and electrons, respectively.

The holes represent absences of electrons in normally full valence bands of an atom. By doping each side of the material with different dopants, a non-conducting region is created between the two doped regions of the junction called the depletion layer. Hole electron pairs created in the depletion region can be collected by a photovoltaic device to power an external circuit.

Each junction also has a band gap specific to the semiconductor material or alloy being doped. The material of each junction may be selected for specific band gaps, depending on the desired wavelength range to be captured from the incoming spectrum. In addition, the different band gap energies result in different operating voltages at the various junctions. Some light-absorbing materials which may be used include silicon, cadmium telluride, copper-indium selenide, gallium arsenide, gallium indium phosphide, and germanium, in addition to other materials known in the art.

Light-absorbing dyes may also be used to increase the capture efficiency of the photovoltaic cell. The band gap of each junction may also be manually altered or engineered to further meet desired specifications. Any other materials or methods well known in the art may be used to further maximize the efficiency of each junction.

The photovoltaic cell (200) in the illustrated embodiment is constructed on a wafer with a substrate material (215), such that it may be integrated with other photovoltaic cells and circuitry. The cell (200) has two junctions, a first junction (205) comprising a low band gap adjacent the substrate (215) and a second junction (210) comprising a high band gap at the surface of the cell (220). The first and second junctions (205, 210) are oriented in the same direction such that the junctions (205, 210) are in series and produce current in the same direction in the circuit.

The cell (200) also may have a tunnel junction (225) and a buffer layer (230) intermediate the first and second junctions (205, 210). The tunnel junction (225) provides for electrical connection between the first and second junctions (205, 210) without using metal interconnects while having low power losses. The tunnel junction (225) also allows the series multi-junction cell (200) to be monolithic. The buffer layer (230) may accommodate lattice matching requirements between the first and second junctions (205, 210) if the junctions are made from different materials.

The cell (200) has first, second, and third terminals (235, 240, 245). The first terminal (235) may be connected directly to the substrate (215). The substrate (215), in this example, acts as an electrical contact. The second terminal (240) may be attached to a tap contact (250) positioned at a place intermediate the first and second junctions (205, 210). In this embodiment, the tap contact (250) is attached to the tunnel junction (225) proximate the buffer layer (230). The third terminal (245) is connected to a top contact (255) attached to the second junction (210) at the surface (220) where the cell (200) is exposed to light.

The second terminal (240) provides an additional branch in the circuit between the junctions, allowing the current through both the first and second junctions (205, 210) to be different, while still placing the junctions in series. The tap contact (250) may be placed at different locations in the stack depending on the configuration of the cell (200). Additionally, the cell (200) may include a new tap contact for every additional junction, such that the cell (200) has a terminal connected to a tap contact intermediate each pair of junctions; for example, a three-junction cell would include four terminals.

While the current embodiment displays the tunnel junction (225) and buffer layer (230) in one possible arrangement, the photovoltaic cell (200) may be constructed such that the tunnel junction (225) may be placed in a different location in the stack of the series connected cell (200). The cell (200) may be constructed using hetero-junctions made of the same material and without a buffer layer (230). The cell (200) may alternatively have a transparent substrate with substrate side illumination, such that the higher band gap junction may be positioned adjacent to the substrate.

Figure 3:
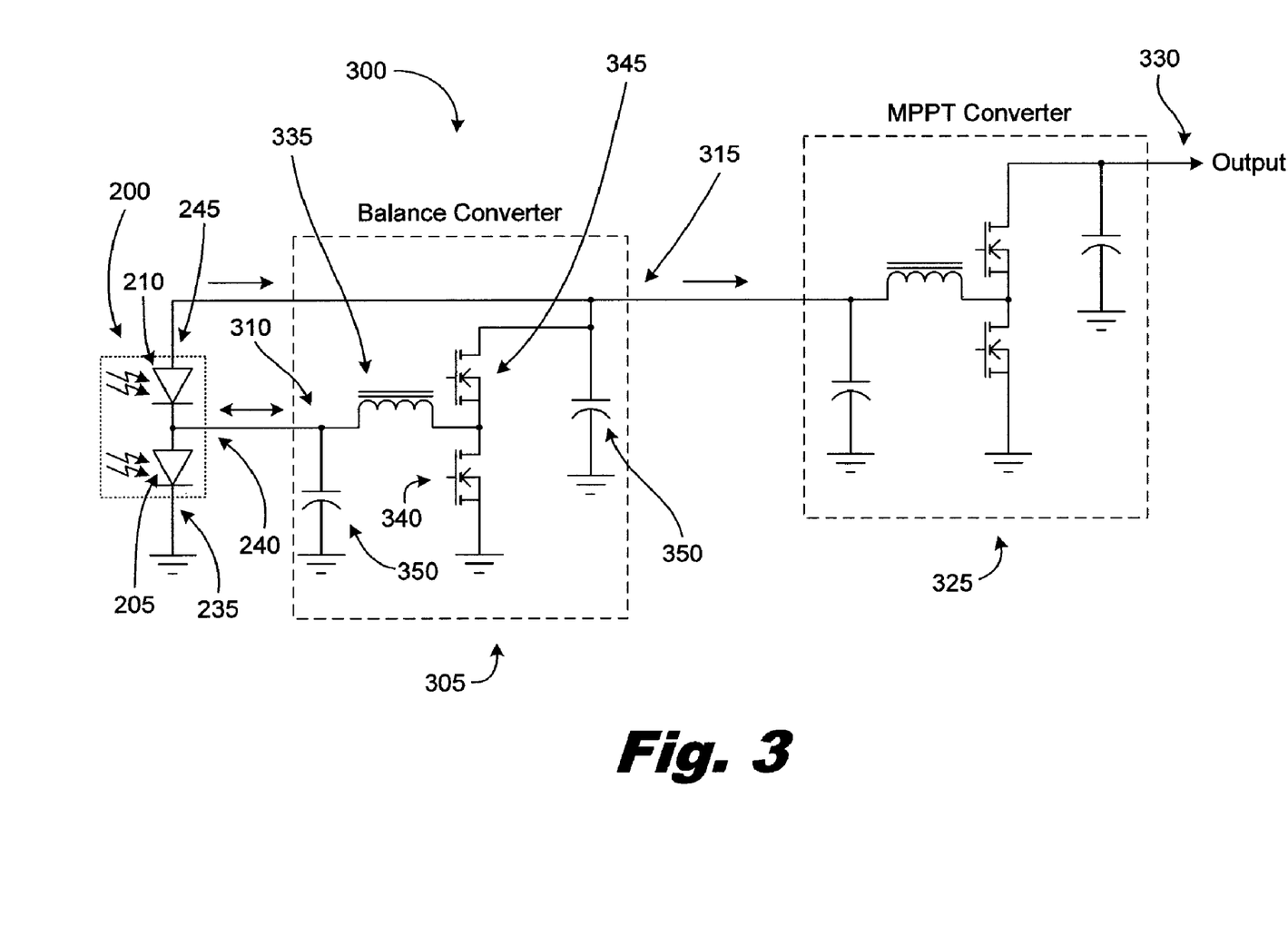
FIG. 3 is a diagram showing one illustrative embodiment of a photovoltaic energy conversion circuit including a series photovoltaic cell according to principles described herein.

FIG. 3 illustrates a circuit (300) comprising a single two-junction photovoltaic cell (200) that allows each junction to operate at its MPP to maximize the overall efficiency of the cell (200). The circuit (300) has a device for processing the difference current between first and second junctions (205, 210) in the cell (200). The device may be a balance converter (305).

The second terminal (240) in the cell (305) is connected to an input (310) of the balance converter (305), and the third terminal (245) is connected to an output (315) of the balance converter (305), such that the balance converter (305) is connected in parallel with the second junction (210) of the photovoltaic cell (200) and in series with the first junction (205). The first terminal (235) is connected to ground as a reference. The circuit (300) also has a maximum power point tracking (MPPT) converter (325) connected to the third terminal (245) of the photovoltaic cell (200) and leading to the output (330) of the circuit (300).

The MPPT converter (325) may be a high efficiency DC to DC converter adapted to convert the entire output of both junctions (205, 210) to the load utilization voltage or current at the maximum power point. DC to DC converters may operate by converting the input DC current to high frequency AC current, running it through a transformer, and then back to a different DC current.

The MPPT converter (325) compares the output of the cell (200) to the load voltage, which may be a battery in many instances. After comparing, the MPPT converter (325) converts the output of the cell (200) to the voltage which will allow the maximum power into the load, for charging the battery or other load. Photovoltaic cells are generally capable of outputting a higher amount of voltage than the load to account for changes in temperature. In solar cells, the performance may vary to a large degree depending on the temperature, particularly if the cells are to be used in both summer and winter. In order to reduce power loss, the MPPT converter (325) attempts to match the voltage between the two as closely as possible. Consequently, without an MPPT converter, photovoltaic cells are likely to experience high amounts of power loss. With a MPPT converter, the amount of power loss is significantly reduced.

The balance converter (305) shown in FIG. 3 is applicable to lower voltage outputs, for example, into a single or a few cells in a battery charger application. The balance converter (305) may be any converter capable of processing the difference currents that may be used. The inductor (335) may be connected to the drain of a first transistor (340) and the source of a second transistor (345). The balance converter (305) may also include shunt capacitors (350) for filtering signal noise at the input and the output of the balance converter.

The balance converter (305) and MPPT converter (325) may be connected to ground as a reference point, which may also help reduce noise or prevent reference mismatches between the photovoltaic cell (200), the balance converter (305), and the MPPT converter (325). The overall rating of the balance converter (305) may be small compared to the power of the complete flow because the current difference between the junctions (205, 210) may only be a small fraction of the total current through the cell (200). The MPPT converter (325) may be designed similarly to the balance converter (305), though the MPPT converter (325) may include different component values. The MPPT converter (325) may also have a different overall circuit rating.

Though the current embodiment shows the balance converter (305) configured in a certain way, the invention may use any sub-circuit which accomplishes the same goal of processing the difference current between junctions in a multi-junction photovoltaic cell. Also, additional junctions may be added to the photovoltaic cell along with tap terminals between each junction and balance converters connected to each tap terminal in order to operate each of the junctions at its respective MPP. This may allow for higher total power to be produced with a single photovoltaic cell.

Figure 4:
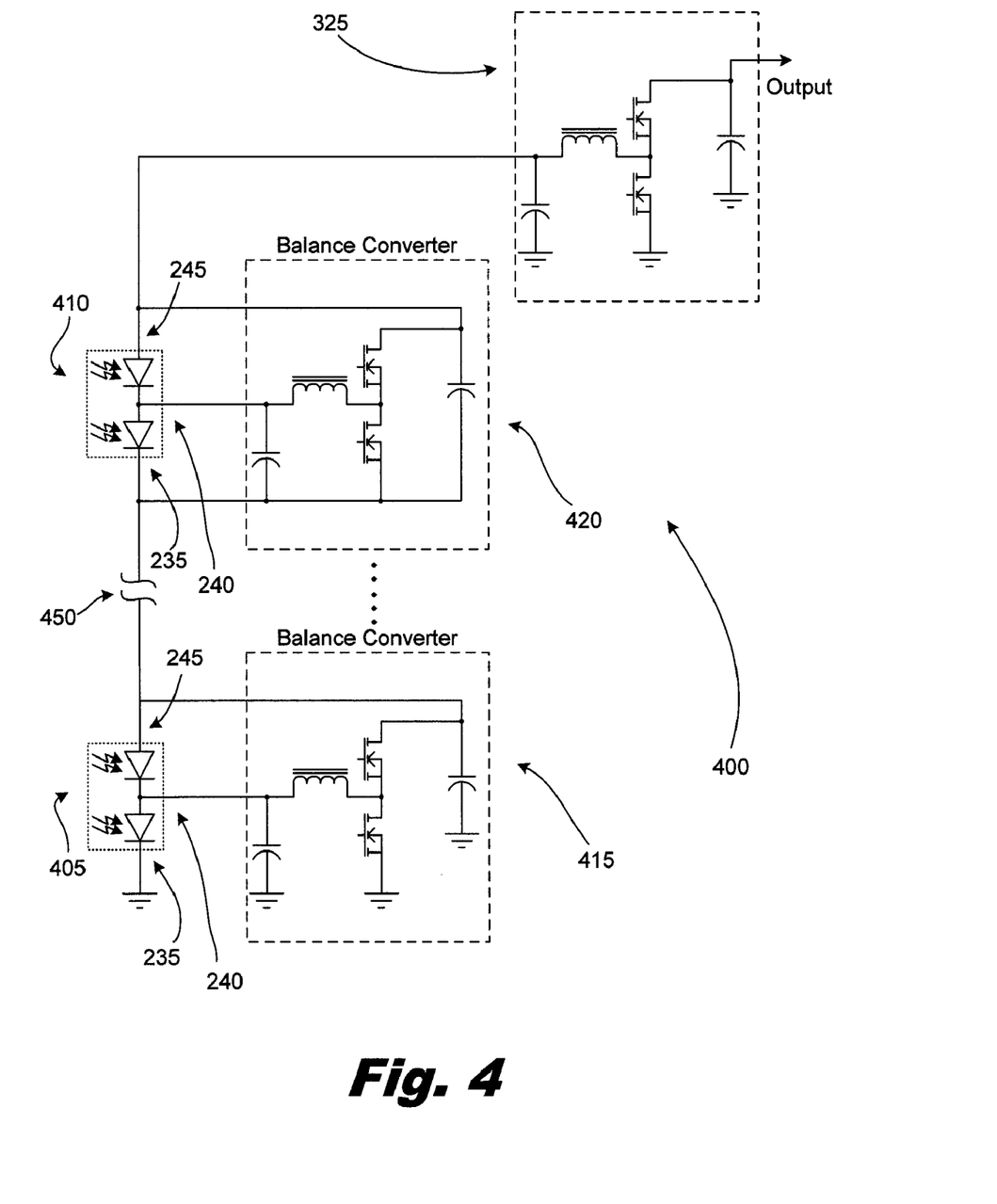
FIG. 4 is a diagram showing one illustrative embodiment of a photovoltaic energy conversion circuit including of a plurality of series photovoltaic cells according to principles described herein.

At higher powers, it may be desirable to operate a photovoltaic conversion circuit at higher voltage to improve the efficiency of the MPPT converter (325). The circuit (400) in FIG. 4 shows a design allowing series interconnection of photovoltaic cells while maintaining the ability to operate each junction at its respective MPP, and therefore, a higher overall power. The circuit (400) shown has first and second two-junction photovoltaic cells (405, 410) in series. First and second balance converters (415, 420) are connected to their respective cells (405, 410) at a second terminal (240) and a third terminal (245). The first terminal (235) of the first cell (405) is connected to ground as a reference point, and the first balance converter (415) for the first cell (405) is also referenced to ground. The first terminal (235) of the second cell (410) may be connected to the third terminal (245) of the first cell (405).

However, there may be additional cells connected in series in the circuit (400), as indicated by the break (450) in the circuit line, in which case the first terminal (235) of the second cell (410) would be connected to the third terminal of the preceding cell. A balance converter connected at each series tier balances the currents between each pair of junctions, allowing them all to operate at MPP. The balance converters connected for each subsequent cell in series after the first cell are referenced to the first terminal of the cell to which the balance converters are connected. This improves upon series connected circuit designs of the prior art which operate each junction in a multi-junction photovoltaic cell at the same current. By connecting a plurality of cells in series, the circuit is able to produce a larger amount of power at the output than a single cell.

Figure 5:
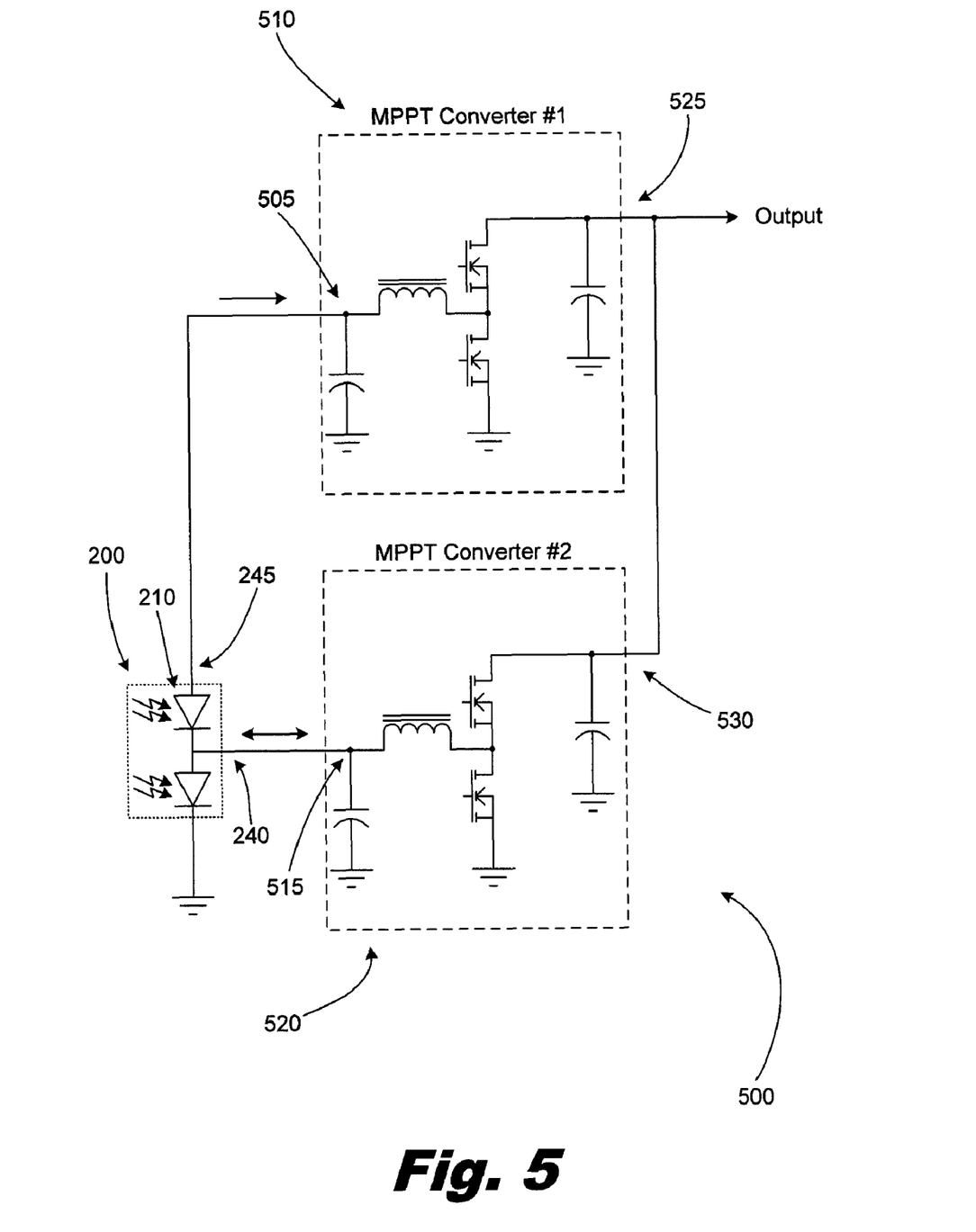
FIG. 5 is a diagram showing one illustrative embodiment of a photovoltaic energy conversion circuit including a series photovoltaic cell according to principles described herein.

FIG. 5 is an alternative configuration of a circuit (500) for operating a multi-junction photovoltaic cell (200) with all junctions operating at their respective MPPs. In this embodiment, the device for independently setting current through each junction in the cell may be a plurality of MPPT converters for each individual junction.

As shown in FIG. 5, the third terminal (245) of the cell (200) may be connected to an input (505) of a first MPPT converter (510). The second terminal (240) may be connected to an input (515) of a second MPPT converter (520). The outputs (525, 530) of the first and second MPPT converters (510, 520) may be connected to each other, such that the first MPPT converter (510) is in series with the second junction (210), and the second MPPT converter (520) is in parallel with the first MPPT converter (510) and the second junction (210).

In this configuration, the second MPPT converter (520) converts the cell output at the second terminal (240) to the load utilization voltage and the first MPPT converter (510) converts the output at the third terminal (245) to the load utilization voltage. The current outputted by the first and second MPPT converters (510, 520) is combined and sent to the load, rather than first combining the outputs of the two junctions (205, 210) and then converting it to the load utilization voltage. In cells with more than two junctions, the circuit may include an additional MPPT converter connected to a new tap terminal for each additional junction.

Figure 6:
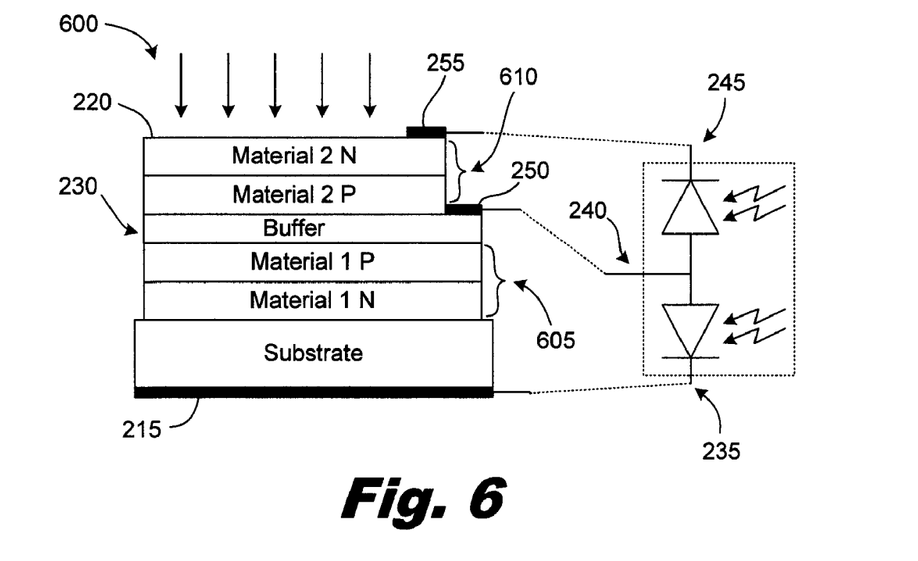
FIG. 6 is a diagram showing one illustrative embodiment of a parallel multi-junction photovoltaic cell according to principles described herein.

FIG. 6 illustrates a possible alternate embodiment of a two-junction photovoltaic cell (600). The photovoltaic cell (600) in the current embodiment is constructed on a substrate (215) such that it may be integrated with other photovoltaic cells and circuitry.

The cell includes two junctions, a first junction (605) comprising a low band gap adjacent the substrate (215) and a second junction (610) having a high band gap at the surface (220) of the cell (600). Similar to the series connected embodiment in FIG. 2, the junctions in the cell (600) may be p-n junctions.

The junctions (605, 610) are oriented on the wafer in opposite directions such that each junction produces current in opposite directions in the circuit. This allows the cell (600) to be placed in parallel with other cells. The cell (600) does not require a tunnel junction in order to have an electrical connection between the first and second junctions (605, 610) and for the multi-junction cell to be monolithic. The cell (600) may have a buffer layer (230) intermediate the first and second junctions (605, 610) to accommodate lattice matching requirements between the two junctions if they are made from different materials, which would allow for a different band gap in each junction.

The cell (600) has first, second, and third terminals (235, 240, 245). The first terminal (235) may be connected to the substrate (215), which acts as a contact. The second terminal (240) is attached to a tap contact (250) positioned at a place intermediate the first and second junctions (605, 610). In this embodiment, the tap contact (250) is attached to the buffer layer (230). The third terminal (245) is connected to a top contact (255) attached to the second junction (210) at the surface (220) where the cell (600) is exposed to light. The second terminal (240) provides an additional branch in the circuit between the junctions, allowing the junctions to be placed in parallel in the circuit. The tap contact may also be attached to the first junction (605) rather than the buffer layer (230). The parallel connected cell (600) may have other monolithic designs as long as it has a tap contact intermediate the junctions.

Parallel connected photovoltaic cells may have several advantages over series connected cells. Tunnel junctions in series connected cells add both cost and complexity due to additional fabrication steps. The tunnel junction also adds additional power loss, reducing the cell efficiency. The major disadvantage of parallel connected cells in the prior art is the inability to connect a plurality of multi-junction parallel connected cells in series for higher output voltage. With the inability to series connect the parallel connected cell in prior art circuits, downstream power converters are forced to operate at the voltage of a single cell, which is relatively low. Operating a converter at the low input voltage of a single cell results in converters with efficiencies that are low enough that the advantages of the parallel connected cell are minimized. However, the present embodiment makes series connection of high band gap junctions in parallel connected cells possible by using an additional converter to boost the output of the low band gap junction, allowing for a higher operating voltage.

Figure 7:
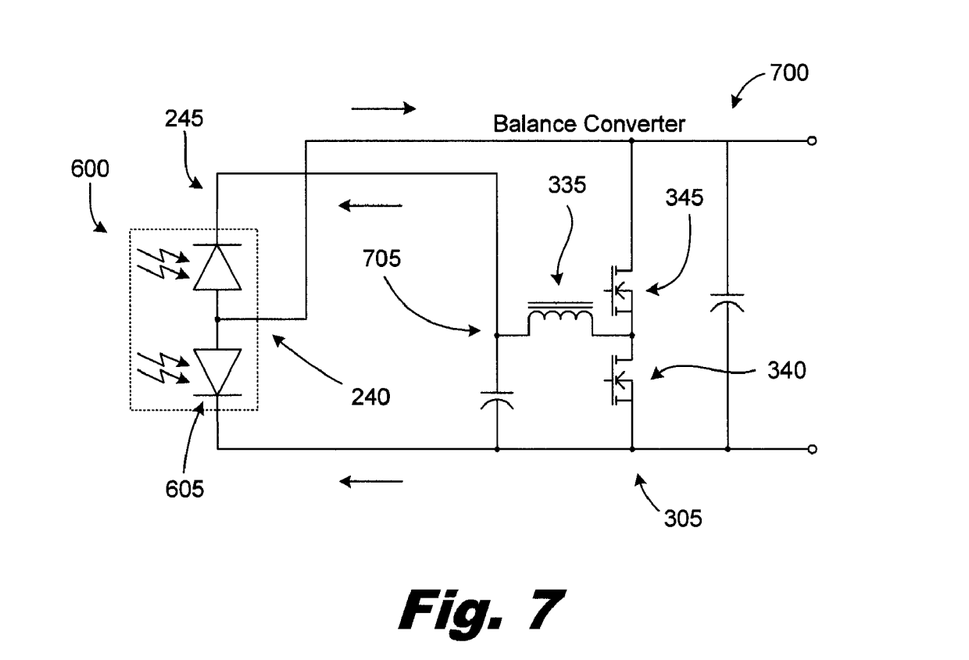
FIG. 7 is a diagram showing one illustrative embodiment of a photovoltaic energy conversion circuit including a parallel photovoltaic cell according to principles described herein.

A basic embodiment of a parallel connected multi-junction cell (600 is shown in FIG. 7. In this embodiment, the second terminal (240) of the cell (600) is connected to an output (700) of a balance converter (305), while a third terminal (245) is connected to an input (705) of the balance converter (305). The balance converter (305) may be a synchronous rectifier boost converter. A boost converter has at least two semiconductor switches and an energy storage element—in this embodiment, two NMOS transistors (340, 345) and an inductor (335)—and is used to step up the output of the lower band gap junction. The balance converter (305) has a duty cycle which is adjusted to operate the low band gap junction at MPP. The second terminal (240) connects the output (700) of the balance converter (305) to the high band gap junction, which is the first junction (605) in this embodiment.

Figure 8:
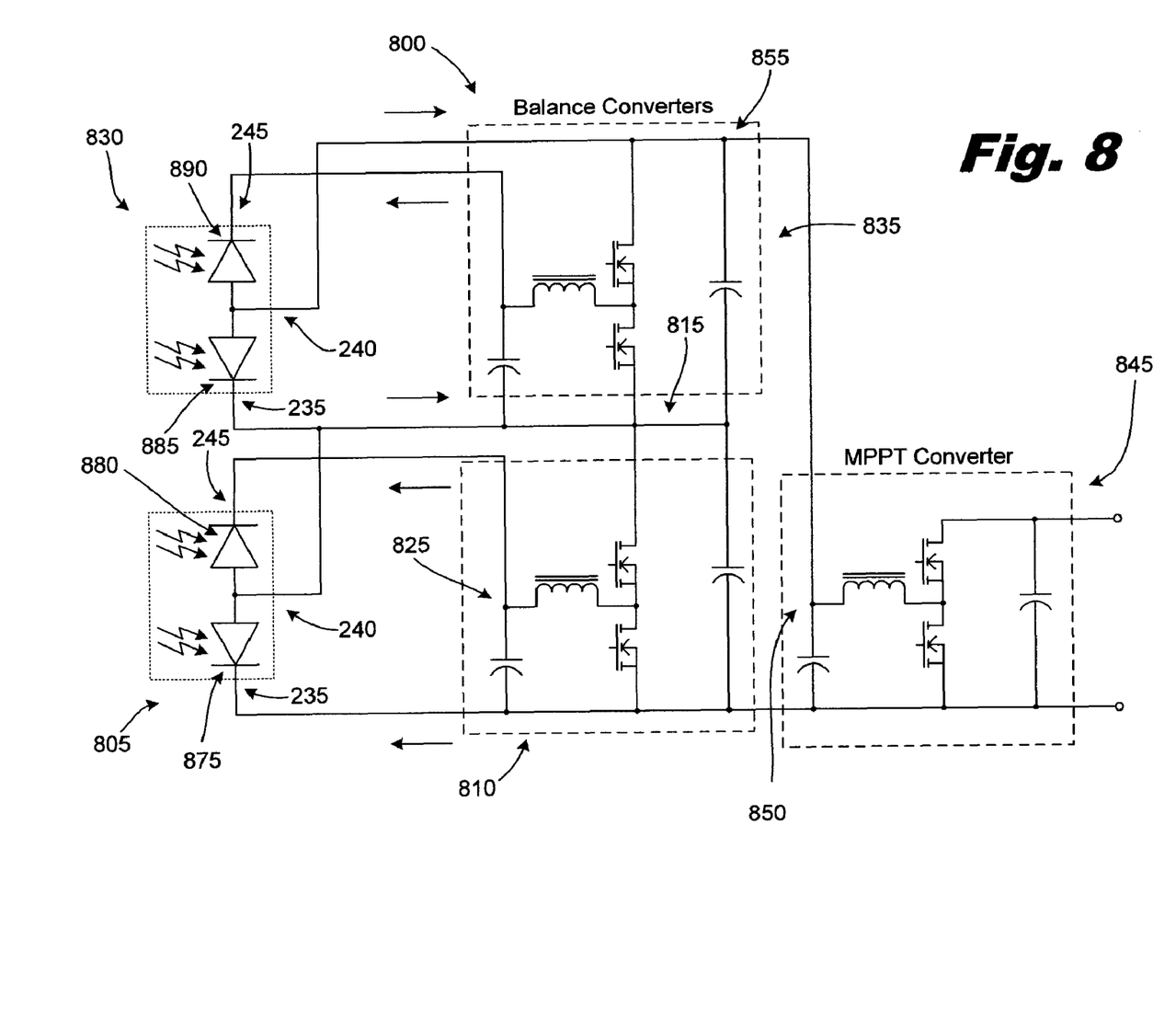
FIG. 8 is a diagram showing one illustrative embodiment of a photovoltaic energy conversion circuit including a plurality of parallel photovoltaic cells according to principles described herein.

At least two cells may be connected in parallel as in the circuit (800) shown in the embodiment of FIG. 8. A first cell (805) is connected to a first balance converter (810) connected similar to the embodiment of FIG. 7, where the output (815) of a first balance converter (810) is connected to a first high band gap junction (875) at the second terminal (240) and the input (825) of the first balance converter (810) is connected to a first low band gap junction (880) at the third terminal (245) of the first cell (805).

A second cell (830) is connected to a second balance converter (835) similar to the first cell (805) and first balance converter (810). The first balance converter (810) is referenced to the first terminal (235) of the first cell (805), and the second balance converter (835) is referenced to the first terminal (235) of the second cell (830). The first terminal (235) of the second cell (830) is also electrically connected to the output (840) of the first balance converter (810), and thus is also connected to the second terminal (240) of the first cell (805).

The circuit (800) also has a MPPT converter (845) with the input (850) of the MPPT converter (845) being connected to the second terminal (240) of the second cell (830) and the output (855) of the second balance converter (835). The MPPT converter (845) is referenced to the first terminal (235) of the first cell (805). Appropriate referencing of each converter facilitates the proper operation of the circuit (800).

Power flow from the high band gap junctions in this embodiment follows a path of least resistance that circumvents the balance converters (810, 835). Current is able to flow through the first high band gap junction (875) in the first cell (805) directly to a second high band gap junction (885) in the second cell (830) and through the outer loop of the circuit to the input (850) of the MPPT converter (845). Therefore, any power produced by the high band gap junctions (875, 885) is uninterrupted and unmodified by the balance converters.

However, power flow from the first low band gap junction (880) and a second low band gap junction (890) passes through both of the balance converters (810, 835) such that the output of the low band gap junctions (880, 890) is stepped up to the output of the high band gap junctions (875, 885). The output of the first low band gap junction (880) is stepped up by the first balance converter (810) and the output of the second low band gap junction (890) is stepped up by the second balance converter (835). The combined outputs are sent to the input of the MPPT converter (845) with the output of the first high band gap junction (875) where the overall output of the circuit (800) is converted to MPP and sent to a load, such as a solar panel output. The MPPT converter (845) is adapted to match the voltage of the high band gap junctions (875, 885) to the panel output.

The balance converters (810, 835) may suffer from low efficiency due to the low output voltage of a single cell. However, the penalty of this low efficiency is offset by the fact that the output of the high band gap junctions (875, 885) will be processed at high efficiency. The penalty is further reduced by the fact that the output of the high band gap junctions is generally significantly greater than half of the total power output of the circuit.

While only two cells are connected in parallel in the current embodiment, as many additional cells may be connected as needed to reach the desired output voltage. The concept of using balance converter to boost the output of a lower voltage junction to the output of a higher voltage junction can be extended to three or more junctions on one cell by using a balance converter for each junction added to the cell.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A photovoltaic circuit, comprising:
at least one multi-junction photovoltaic cell, comprising at least first, second, and third terminals;
a first junction of said photovoltaic cell positioned intermediate said first and second terminals;
a second junction of said photovoltaic cell positioned intermediate said second and third terminals; and
a device for independently setting current flow through said first junction and said second junction to allow for maximum power point operation of each junction, said device for setting current flow being connected to said second terminal, wherein said device for independently setting current flow comprises a balance converter sub-circuit.

2. The circuit of claim 1, further comprising a first maximum power point tracking (MPPT) converter connected to an output of said photovoltaic conversion circuit.

3. The circuit of claim 2, wherein said device for independently setting current flow comprises a second MPPT converter connected to said second terminal and said output, such that said second MPPT converter is connected in parallel with said second junction and said first MPPT converter.

4. The circuit of claim 1, wherein said first and second junctions are p-n junctions.

5. The circuit of claim 1, wherein said first and second junctions comprise different band gap energies.

6. The circuit of claim 1, further comprising at least three junctions.

7. The circuit of claim 6, further comprising a fourth terminal.

8. The circuit of claim 7, further comprising a second device for independently setting current flow through said second junction and said third junction to allow for maximum power point operation of each junction.

9. The circuit of claim 1, wherein said photovoltaic cell is monolithic.

10. The circuit of claim 1, wherein a tunnel junction is disposed between said first junction and said second junction.

11. The circuit of claim 10, wherein said second terminal is connected to said tunnel junction.

12. The circuit of claim 1, wherein said photovoltaic cell further comprises a transparent substrate proximate said first junction, and said first junction comprises a higher band gap energy than said second junction.

13. The circuit of claim 1, wherein said first junction and said second junction are hetero-junctions.

14. The circuit of claim 1, wherein said photovoltaic cell comprises at least one buffer layer.

15. The circuit of claim 14, wherein said second terminal is connected to said buffer layer.

16. The circuit of claim 1, wherein said first junction and said second junction are connected in parallel.

17. A photovoltaic energy conversion circuit, comprising:
at least one multi junction photovoltaic cell comprising at least first, second, and third terminals;
a first junction disposed intermediate said first and second junctions, and a second junction disposed intermediate said second and third junctions;
a means for independently setting current flow through said first junction and said second junction to allow for maximum power point operation of each junction, said means for setting current flow being connected to said second terminal; wherein said means for independently setting current flow comprises a balance converter sub-circuit; and
a maximum power point tracking (MPPT) converter connected to an output of said photovoltaic conversion circuit.

18. A method of operating a photovoltaic circuit, said circuit comprising a multi-junction photovoltaic cell with junctions connected in series, said method comprising operating each junction at a different, respective maximum power point, said multi-junction photovoltaic cell comprising at least first, second, and third terminals; a first junction of said photovoltaic cell positioned intermediate said first and second terminals; a second junction of said photovoltaic cell positioned intermediate said second and third terminals; and a device for independently setting current flow through said first junction and said second junction to allow for maximum power point operation of each junction, said device for setting current flow being connected to said second terminal.

19. The method of claim 18, further comprising:
connecting a tap terminal intermediate first and second junctions in said photovoltaic cell;
connecting a device for balancing current through said first and second junctions to said tap terminal;
connecting a maximum power point tracking converter to an output of said photovoltaic cell; and
operating said first and second junctions at a maximum power point current for each respective junction.

* * * * *

UNITED STATES PATENT AND TRADEMARK OFFICE
CERTIFICATE OF CORRECTION

| | | |
|---|---|---|
| PATENT NO. | : 8,088,991 B2 | |
| APPLICATION NO. | : 12/251162 | |
| DATED | : January 3, 2012 | |
| INVENTOR(S) | : Matthew Beasley et al. | |

It is certified that error appears in the above-identified patent and that said Letters Patent is hereby corrected as shown below:

In column 10, line 22, in Claim 17, delete "multi junction" and insert -- multi-junction --, therefor.

Signed and Sealed this
Sixteenth Day of October, 2012

David J. Kappos
*Director of the United States Patent and Trademark Office*